US011018271B2

(12) United States Patent
Demonte et al.

(10) Patent No.: US 11,018,271 B2
(45) Date of Patent: May 25, 2021

(54) GRAPHIC APPEARANCE FOR SOLAR MODULES

(71) Applicant: Kamereon, Inc., Los Gatos, CA (US)

(72) Inventors: Andrea Demonte, Turin (IT); Daniele Pes, Milan (IT)

(73) Assignee: Kamereon, Inc., Los Gatos, CA (US)

( * ) Notice: Subject to any disclaimer, the term of this patent is extended or adjusted under 35 U.S.C. 154(b) by 0 days.

(21) Appl. No.: 16/818,160

(22) Filed: Mar. 13, 2020

(65) Prior Publication Data

US 2020/0303568 A1  Sep. 24, 2020

Related U.S. Application Data

(60) Provisional application No. 62/819,802, filed on Mar. 18, 2019.

(51) Int. Cl.
*H01L 31/0216* (2014.01)
*D03D 9/00* (2006.01)
(Continued)

(52) U.S. Cl.
CPC ......... *H01L 31/02167* (2013.01); *D03D 1/00* (2013.01); *D03D 9/00* (2013.01);
(Continued)

(58) Field of Classification Search
CPC .............. H01L 31/02167; H01L 31/18; H01L 31/0481; D03D 9/00; D03D 1/00;
(Continued)

(56) References Cited

U.S. PATENT DOCUMENTS 8,104,203 B2   1/2012  Mackler
8,513,517 B2   8/2013  Kalkanoglu et al.
(Continued)

FOREIGN PATENT DOCUMENTS

KR   20110086586 A   7/2011
KR     101527362 B1   6/2015
(Continued)

OTHER PUBLICATIONS

International Search Report dated Jul. 2, 2020 for PCT Patent Application No. PCT/IB2020/052329.

*Primary Examiner* — Christopher J Besler
*Assistant Examiner* — Christine Bersabal
(74) *Attorney, Agent, or Firm* — MLO, a professional corp.

(57) ABSTRACT

Methods of producing a graphic mesh for a solar module are described in which mesh parameters such as warp fiber thickness, weft fiber thickness, and open area size are determined to meet a target energetic efficiency and a chromatic effectiveness. In some embodiments, chromatic effectiveness is based on mesh count, where the mesh count is set according to a distance at which the mesh will be viewed when assembled into the solar module. The mesh has a plurality of warp fibers having the warp fiber thickness and a plurality of weft fibers having the weft fiber thickness, that are interlaced to form a plurality of mesh unit cells. A graphic appearance is printed into the mesh using a coloring substance, where the coloring substance is absorbed by the fiber material to form the graphic mesh.

10 Claims, 10 Drawing Sheets

(51) Int. Cl.
    *D06M 15/227*     (2006.01)
    *D03D 1/00*     (2006.01)
    *H01L 31/18*     (2006.01)
    *H01L 31/048*     (2014.01)
    *D06P 5/00*     (2006.01)

(52) U.S. Cl.
    CPC .............. *D06M 15/227* (2013.01); *D06P 5/00* (2013.01); *H01L 31/0481* (2013.01); *H01L 31/18* (2013.01); *D10B 2505/18* (2013.01)

(58) Field of Classification Search
    CPC .... D03D 15/0033; D06M 15/227; D06P 5/00; D10B 2505/18
    See application file for complete search history.

(56) References Cited

U.S. PATENT DOCUMENTS

| | | |
|---|---|---|
| 9,911,871 B1 | 3/2018 | Lentine et al. |
| 2008/0178928 A1 | 7/2008 | Warfield et al. |
| 2009/0242021 A1* | 10/2009 | Petkie ............... H01L 31/02168 136/256 |
| 2013/0145588 A1 | 6/2013 | Nakata |
| 2014/0326292 A1* | 11/2014 | Yordem ................ H01L 31/048 136/246 |
| 2016/0042874 A1* | 2/2016 | Kim ..................... H01G 9/2022 136/256 |
| 2016/0072430 A1 | 3/2016 | Gilbert et al. |
| 2016/0218234 A1 | 7/2016 | Balasubramanian et al. |
| 2016/0254404 A1 | 9/2016 | Dries et al. |
| 2016/0351343 A1 | 12/2016 | Lindström et al. |
| 2017/0085216 A1 | 3/2017 | Balasubramanian et al. |
| 2018/0122973 A1 | 5/2018 | Pilliod et al. |

FOREIGN PATENT DOCUMENTS

| | | |
|---|---|---|
| WO | 2008152574 A1 | 12/2008 |
| WO | 2013056747 A1 | 4/2013 |
| WO | 2014165830 A2 | 10/2014 |
| WO | 2017103350 A1 | 6/2017 |
| WO | 2017168456 A1 | 10/2017 |

* cited by examiner

EXAMPLE B
Mesh unit cell size = 0.85 mm x 0.6 mm
Thickness of weft yarn = 0.125mm
Thickness of warp yarn = 0.2mm
Same geometric (energetic) efficiency of Example A = 60%

$$\frac{\left[\left[0.85mm - 2 \times \frac{0.2}{2}\right] \times \left[0.6mm - 2 \times \frac{0.125}{2}\right]\right]}{[0.85mm \times 0.6mm]} = 60\%$$

EXAMPLE C
Mesh unit cell size = 1.25 mm x 1.25 mm
Thickness of weft yarn = 0.15 mm
Thickness of warp yarn = 0.15 mm
Higher geometric (energetic) efficiency than Example A = 81%

$$\frac{\left[\left[1.25mm - 2 \times \frac{0.15}{2}\right] \times \left[1.25mm - 2 \times \frac{0.15}{2}\right]\right]}{[1.25mm \times 1.25mm]} = 81\%$$

GRAPHIC APPEARANCE FOR SOLAR MODULES

RELATED APPLICATIONS

This application claims priority to U.S. Provisional Patent Application No. 62/819,802, filed on Mar. 18, 2019, and entitled "Graphic Appearance for Solar Modules"; which is hereby incorporated by reference in its entirety.

BACKGROUND

Photovoltaic panels (i.e., solar modules, solar panels) are necessarily exposed to the sun, covering external surfaces of supporting infrastructures such as buildings, vehicles and outdoor accessories. The exposed surface of photovoltaic cells in the photovoltaic panels is typically black in order to have the highest possible efficiency of electric energy generated by such panels. The amount of surface area of a structure to be covered by solar panels can be considerable, to generate the required amount of energy and, consequently, can be aesthetically unpleasant because of the black color of the cells. In some situations, local regulation restrictions may limit or even prohibit installment of the photovoltaic panels.

Many solutions have been utilized for improving the aesthetic appearance of solar panels, where the improvement can camouflage the panel to blend into its surrounding environment or provide an image or design that will be visible instead of the solar cells within the panel. For example, one or more layers of coloring can be incorporated into solar cells by adding a coloring material or by employing layers that reflect a certain wavelength to result in the appearance of the color corresponding to that wavelength. In some solutions, these colored solar cells can be used as pixels to create an overall pattern by a solar module assembled from the solar cells, where the displayed pattern is visible to an observer. Other solutions for improving aesthetic appearance are implemented at the module level, such as by printing an image on a continuous transparent sheet or film that is laid onto the photovoltaic panel. The image is composed of a multitude of isolated, opaque dots or other shapes that, when viewed as a whole, conveys the overall desired image. The printing is typically a coating or ink that is deposited onto the surface of the transparent sheet.

As the demand for renewable energy continues to grow, the ability to provide solar panels that have an aesthetically pleasing appearance is desirable.

SUMMARY

In some embodiments, methods of producing a graphic mesh for a solar module include selecting a fiber material for a mesh, the fiber material being absorbent for a coloring substance. A warp fiber thickness, a weft fiber thickness, and an open area size of the mesh are determined to meet a target energetic efficiency and a chromatic effectiveness. The mesh made of the fiber material is provided, where a plurality of warp fibers having the warp fiber thickness and a plurality of weft fibers having the weft fiber thickness are interlaced to form a plurality of mesh unit cells. Each mesh unit cell has an opening with the open area size. A graphic appearance is printed into the mesh using the coloring substance, where the coloring substance is absorbed by the fiber material to form the graphic mesh.

In some embodiments, methods of producing a graphic mesh for a solar module include determining a warp fiber thickness and a weft fiber thickness of a mesh to meet a target energetic efficiency. The determining utilizes a chromatic effectiveness that is based on a mesh count, where the mesh count is set according to a distance at which the mesh will be viewed when assembled into the solar module. The methods also include providing the mesh made of a fiber material, where a plurality of warp fibers having the warp fiber thickness and a plurality of weft fibers having the weft fiber thickness are interlaced to form a plurality of mesh unit cells. Each mesh unit cell has a size according to the mesh count. A graphic appearance is printed into the mesh using a coloring substance, where the coloring substance is absorbed by the fiber material to form a graphic mesh.

In some embodiments solar modules include a solar cell layer, a graphic mesh and an encapsulating layer. The solar cell layer has a plurality of solar cells with light-incident surfaces. The graphic mesh is placed over the light-incident surfaces of the plurality of solar cells. The graphic mesh has a plurality of fibers interlaced with each other and that form openings between the plurality of fibers. The graphic mesh has a graphic appearance printed into the plurality of fibers by absorbing a coloring substance. The encapsulating layer is over the graphic mesh. The encapsulating layer, the graphic mesh and the solar cell layer are laminated together. The graphic mesh has a warp fiber thickness, a weft fiber thickness, and an open area size of the graphic mesh to meet a target energetic efficiency and a chromatic effectiveness.

DETAILED DESCRIPTION

The present embodiments provide designs and methods in which a mesh (e.g., fabric) is used to provide a graphic appearance for a solar module. The graphic appearance can, for example, hide the solar cells in the module from view, camouflage the overall module within its surroundings, or display a particular design such as an image or advertisement. The use of a mesh for providing an aesthetic appearance for the module enables unique flexibility in customizing a balance between light transmission to the solar cells and visual efficacy of the graphic appearance. Furthermore, the mesh is printed such that a coloring substance, such as an ink or other pigment used for creating the graphic, is absorbed into the fibers of the mesh, thus providing a durable image that can withstand environmental conditions during operation of the solar module. The mesh is also a durable material that can be incorporated into manufacturing steps involved with assembling the solar module.

Figure 1:
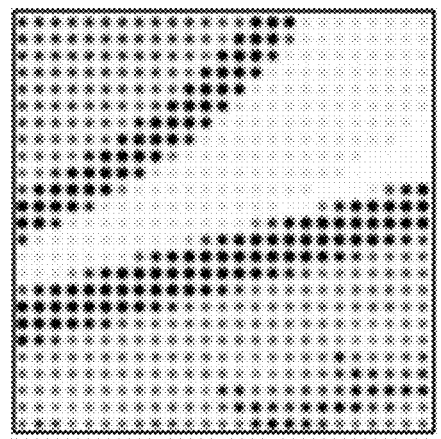
FIG. 1 is an example of a graphic image composed of individual dots, as known in the art.

Some conventional solutions for imposing an aesthetic appearance on a solar panel create opacity of the desired graphic by printing colored dots or frames on a continuous transparent (or partially transparent) layer that is placed above the solar cells of the panel. The opacity may be printed, for example, onto an external or internal surface of a frontsheet layer of the panel. The effect of these individual dots or frames is that of a discontinuous pixeled printout, such as the example shown in FIG. 1. The possible capability to render images, including complex images, using separated pixels on a panel is due to the sampling ability of human brain to perceive, depending on the printing resolution, a discontinuous image as a continuous one.

The present embodiments describe a new way to disguise the photovoltaic cells of a photovoltaic module by providing a surface with a design that is aesthetically pleasing and compatible with the environment of deployment, while still having a solar efficiency that is comparable to a photovoltaic module without the aesthetic modification. Photovoltaic modules using the present colored meshes counter-intuitively achieve acceptable energy efficiencies even though colors different from black negatively affect solar cell efficiency because of physics. That is, solar modules with light-receiving surfaces that are not completely black or not dark-colored would be expected to be much less efficient than black or dark-colored modules since darker colors absorb more light. Also, adding a layer (such as a mesh) onto a solar module that partially blocks sunlight from being transmitted to the underlying solar cells would typically be considered to be detrimental to the efficiency of the module. Yet surprisingly, the colored mesh structures of the present embodiments maintain high efficiency of the modules because the meshes are uniquely designed to allow the needed amount of sunlight to be received to achieve target energy production needs, while providing a sufficient amount of imaging surface to effectively disguise the solar module visually.

In this disclosure, chromatic or aesthetic effectiveness is the effectiveness of the discontinuous image to be perceived as continuous by the human eye. The present images that are printed on meshes are discontinuous because the openings within the mesh (i.e., open spaces, holes, apertures) create gaps in the image where there is no color or printing. The higher the resolution of printed surface, the better the chromatic effectiveness. For a given surface (i.e., a fabric or mesh of the present embodiments), such resolution is based upon the ratio between the portion of the mesh that is opaque/printed and the portion of the mesh that is transparent/empty.

Energetic efficiency in this disclosure is the capability of a solar panel to convert the available solar energy into electrical power. More specifically, the energetic efficiency is the ratio between the electric power generated by a panel exposed to sunlight through a mesh/fabric and the electric power generated by the same solar panel without the imprinted graphic fabric. This energetic efficiency is calculated by the amount of exposed area of a solar cell with the mesh relative to without the mesh over it.

In this disclosure, the terms mesh, fabric, and net shall be used interchangeably to refer to a material that has interlaced fibers that form openings or apertures between the fibers, and on which a graphic is to be printed. Similarly, the terms fiber, thread and yarn shall be used interchangeably for the elements that are interlaced to form the mesh. The term graphic mesh may be used to refer to a mesh that has an image printed into it. The terms interlaced, woven, entangled, and the like shall be used to mean any pattern of forming fibers into a mesh. Also, the terms solar panel, solar module, photovoltaic panel and photovoltaic module shall be used interchangeably.

Figure 2:
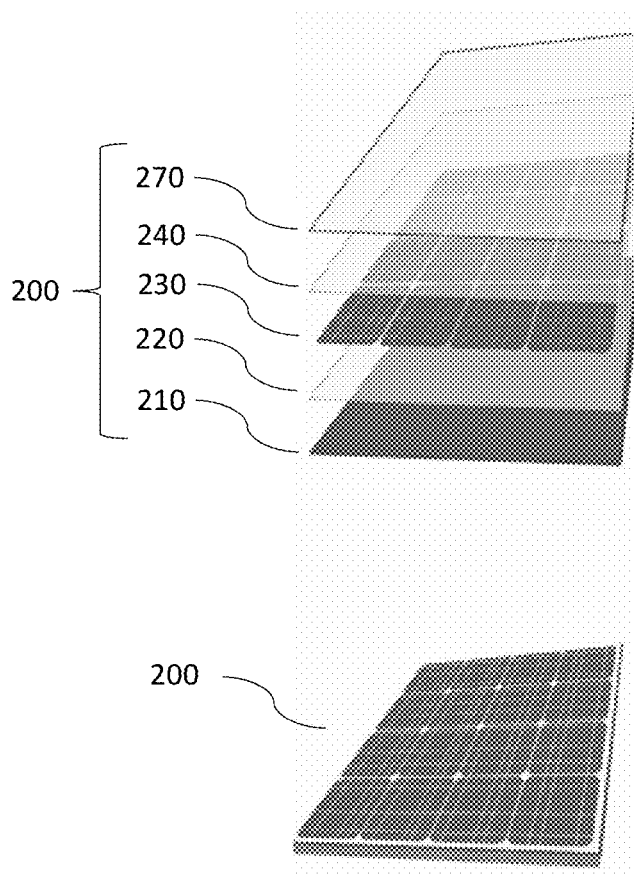
FIG. 2 is an exploded view of layers in a conventional photovoltaic panel.

A solar panel is created as a stack of several adjacent layers of different materials. As generally shown in FIG. 2, a conventional solar panel (module) 200 has a bottom backsheet layer 210 which is typically black, followed by an encapsulant layer 220 (e.g., ethylene vinyl acetate "EVA" or polyolefin elastomers "POE") that acts as a glue for bonding layers together, a plurality of photovoltaic cells in a solar cell layer 230, an encapsulant layer 240, and a top layer frontsheet 270 (which can be made of, e.g., glass or plastic materials). Other variations are used by different manufacturers due to less or insertion of more, extra encapsulant layers as well as to the relative order by which the layers are composed. For example, additional protective layers may be placed on top of the stack by different panel producers. Several layers of encapsulation material (e.g., EVA or POE films) are usually added to have strong adhesion between layers, such as to avoid forming of moisture within the module.

In known solutions of using a transparent sheet printed with dots or other shapes to convey an image in a solar module, the printed sheet is often inserted above the solar cell layer 230 and covered with another encapsulant layer. The colored (i.e., printed) sheet is partially transparent and partially opaque to light so that light itself can reach the photovoltaic cells in layer 230. In many cases of these known solutions, a glass frontsheet is used as the transparent sheet on which to print the image, where ultraviolet printing is made on the internal surface of the glass to render a partially opaque grid.

The present embodiments provide an aesthetically pleasing solar panel with a different solution from existing approaches and furthermore address a different class of needs from the existing approaches. That is, in addition to enabling solar panels to be made with a color rendering consistent with specific requirements related to their physical location, the present embodiments uniquely enable the ability to have independent (or partially independent) techniques to customize trade-offs in color rendering and energy efficiency. For example, if, in order to achieve a certain color rendering, a particular printing technique or method is chosen, the mesh configuration can be tailored independently of the printing method in order to modify the energy efficiency, which gives an extra degree of freedom in the design of the fabric. Since the energy efficiency of different mesh configurations is measurable and can be calculated a priori, the choice of a specific mesh configuration can be made in order to have the best possible color rendering. Conversely, given a certain mesh configuration and therefore energy efficiency, a print configuration can be chosen that maximizes the durability of the printed image and/or minimizes the cost and time required to print. A benefit of the present embodiments is that in order to create a mesh that meets requirements of a given chromatic effectiveness and energy efficiency, it is not necessary to go by trial and error and check for proper aesthetics and energy efficiency ex post (as would happen if, for example, ultraviolet inks were printed on a semi-transparent layer). Instead, in an example scenario, energy efficiency for particular mesh configurations can be provided and the printing configuration can then be fine-tuned to have the best color rendering.

In this disclosure a mesh or fabric is used as the graphic component for creating a partially opaque layer, where the mesh has a desired pattern embedded into it and then is laminated into a photovoltaic panel during the manufacturing of the panel. Photovoltaic panels realized through the present technology can be aesthetically customized to integrate photovoltaic panels into the environment where the panel will be deployed, such as an architectural or landscape setting. While the use of a mesh in a solar module is unique in itself, the mesh also uniquely provides an economically sustainable production lever to change chromatic effectiveness and energetic efficiency. This is because producing different types of meshes (e.g., by adjusting yarn material, mesh size, mesh shape and/or mesh count) is more convenient for tailoring a desired balance between visual and functional efficiency than transforming an innately transparent, continuous material (e.g., a glass frontsheet) into a partially opaque layer as in conventional systems. Additionally, the present meshes and fabrics provide long-lasting chromatic effectiveness that is more resistant to ultraviolet exposure from sunlight and/or erosion from environmental conditions such as the weather, compared to other existing approaches. This is due to the present embodiments using materials and printing techniques in which the ink is partially absorbed by, and not just merely deposited on, the mesh.

Mesh Configuration

Various aspects of configuring the meshes of the present embodiments shall now be described. The present embodiments are based on using a mesh of flexible material, that is a net of natural or artificial fibers (e.g., yarn or thread), as a fabric to constitute a partially opaque grid. The mesh is configured to allow as much light as possible to pass through to the underlying solar cell, while providing a base surface to be printed for rendering an externally perceivable image. In general, a mesh can be considered as a plurality of holes separated by opaque frames. In the present embodiments, printing of a continuous image is applied to the discontinuous surface provided by the mesh. The mesh is opaque where the fibers are present but open in the apertures between fibers of the grid, such that an image printed into the fibers of the mesh substrate is discontinuous.

Figure 3:
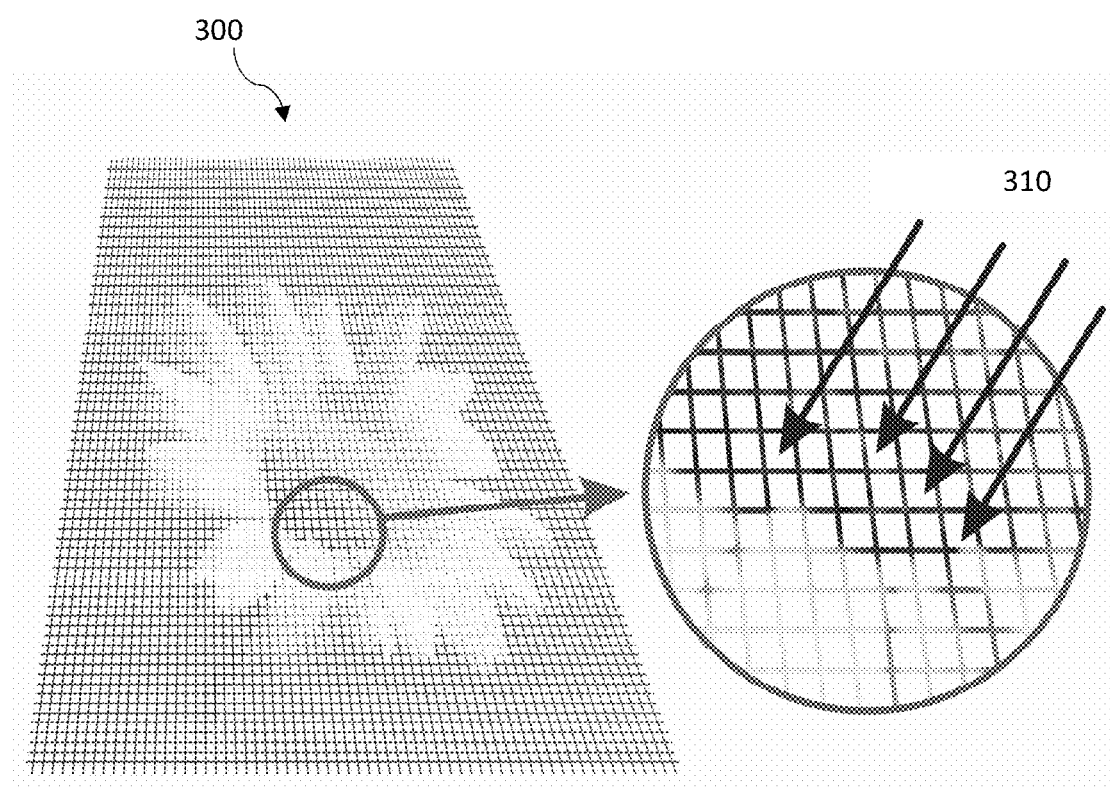
FIG. 3 is a perspective view of a graphic mesh, in accordance with some embodiments.

FIG. 3 shows an example of a graphic (colored) mesh 300, in accordance with some embodiments. The fibers of the mesh 300 are printed with a graphic, such as an image of a light-colored flower on a darker-colored backdrop in this illustration. The image is embedded into the threads of the graphic mesh 300, while sunlight 310 passes through the open spaces of the graphic mesh. What is perceived by the human eye is actually an approximately continuous sampling of a discontinuous, pixeled image. The image itself is pixeled because of the holes in the mesh that constitute the fabric on which the image itself is printed. The graphic resolution of the rendered image depends on the configuration of the opaque surface being printed on the mesh.

The graphic appearances that can be printed on meshes in the present disclosure can include, but are not limited to, single colors, patterns to match a structure on which the panel will be mounted (e.g., rooftop or wall of a building), text, and/or images of objects or people.

The geometry of meshes and fabrics are characterized in the fabric industry by metrics such as mesh count, which can be defined as either a number of wires or openings per linear inch. Thread count is a number of threads contained in one square inch or one square centimeter, including both warp and weft (vertical and horizontal, respectively) threads.

The graphic mesh components of the present disclosure are designed to balance chromatic effectiveness and energetic efficiency. With a large mesh (i.e., lower mesh count) the transmission of light is greater than with a small mesh (higher mesh count), and the input rate of energy to the solar cells underneath is consequently higher. Thus, a coarser mesh results in a better energetic efficiency, in that the mesh causes minor energy losses since the mesh allows better exposure of light to underlying solar cells than a finer mesh. However, as a consequence of a coarser mesh, the amount of printed surface is reduced, and the chromatic effectiveness is lower due to the decreased resolution of the rendered image and its contiguity, as perceivable by the human eye.

In the present disclosure, there are two primary factors that are used to affect chromatic effectiveness and energetic efficiency: thickness of the mesh fibers (i.e., yarn, thread) and the geometry (size and shape) of the mesh. Regarding thickness of the yarn, a fabric is created by interlacing weft (horizontal) and warp (vertical) yarns. The greater the thickness of each yarn, the greater the surface that will be dyed by ink during the printing phase. That is, the larger the opaque diameter of the threads of the fabric, the higher the chromatic effectiveness since larger threads provide more surface area to be printed, such that the final printed image results in a more continuous (i.e., higher resolution, less fragmented or pixeled) image. However, the greater the thickness of each yarn, the lower the energetic efficiency since increasing the opaque surface area decreases the light being received by the solar cells, thus reducing the solar power produced by the panel.

Figure 4:
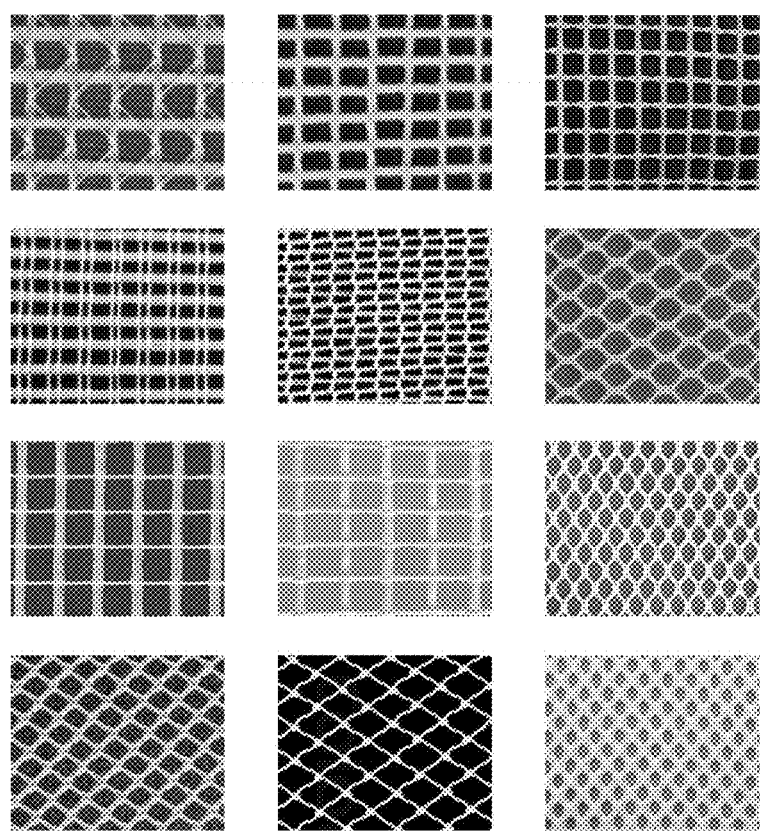
FIG. 4 shows examples of mesh patterns that can be used for graphic meshes, in accordance with some embodiments.

Regarding size and shape (i.e., geometry) of the mesh, each mesh results from the entanglement between consecutive yarns of weft and warp, to form, for example, a parallelogram or other shapes. FIG. 4 depicts examples of different geometric patterns that can be used for meshes of the present disclosure, where the patterns include but are not limited to squares, rectangles, diamonds, and honeycomb. For different types of meshes having the same opaque/transparent ratio but different weaving patterns/shapes, the way the human brain samples an image printed on the different backgrounds (i.e., different geometric patterns) and perceives them as continuous can greatly vary. Consequently, the shape of mesh affects the aesthetic effectiveness and can be selected accordingly based on requirements related to, for example, the location of deployment of photovoltaic panels and the distance from which observers are viewing the panels.

The greater the empty area framed by the parallelogram or shape formed by the weft and warp yarns, the greater the effective transparency of the fabric to light, and thus the higher the energetic efficiency. Conversely, a greater open area means less opaque surface available for printing, resulting in a more fragmented and pixeled image and a lower chromatic effectiveness.

In the present embodiments, each of the two drivers—yarn thickness and mesh geometry—are specifically dimensioned to affect chromatic effectiveness and energetic efficiency for the specific application of a particular solar panel. Several possible combinations of the factors can be used to find a proper balance between chromatic effectiveness and energetic efficiency, where the chosen results will depend at least in part on the distance at which an observer will view the deployed panels. For example, a panel that will be viewed at close range may be designed with high chromatic effectiveness (resolution), such as by using higher mesh count, smaller mesh openings and/or thicker yarn. Conversely, a rooftop panel could be designed with lower resolution—e.g., lower mesh count, larger openings and/or thinner yarn—and higher energetic efficiency since the panel will be viewed with less discrimination at a distance. In various embodiments, the thickness of the yarn can range between, for example, 0.1 mm to 1.0 mm. The size of the mesh openings (apertures) may range from, for example, 0.5 mm$^2$ to 3.5 mm$^2$ and more.

As described above, energetic efficiency in the present disclosure is the ratio between the electric power generated by a panel having a printed mesh and the electric power generated by the same solar panel without the mesh. Because the amount of power is related to the surface area of a solar cell exposed to sunlight, energetic efficiency is calculated from the open area and yarn dimensions in a unit cell of the mesh. The energetic efficiency is calculated as a percentage value which may generally be expressed as:

$$\text{Energetic efficiency} = \frac{\text{open area in a mesh unit cell}}{\text{mesh unit cell size}} \quad \text{(Eq. 1a)}$$

OR $$\text{Energetic efficiency} = \frac{\text{mesh unit cell size-area occupied by yarn thicknesses}}{\text{mesh unit cell size}} \quad \text{(Eq. 1b)}$$

Specific calculations will depend on the geometry of the weave in the mesh. For example, for a mesh having a rectangular weave with warp yarns (vertical) of thickness t1, weft yarns (horizontal) of thickness t2, and a mesh unit cell being X wide and Y high, the energetic efficiency is:

$$\text{Energetic efficiency} = \frac{\left(X - 2*\frac{t1}{2}\right)*\left(Y - 2*\frac{t2}{2}\right)}{X*Y} \quad \text{(Eq. 2)}$$

Calculations for hexagonal, rhombic or other weave geometry of the mesh will employ formulas for area specific to those geometries.

Target energetic efficiency levels may be set by a manufacturer and/or customer based on factors such as, but not limited to, energy requirements of the device or facility being powered by the solar panel, efficiency of the solar cells in the solar module, return on investment goals of the installer, or deployment location of the solar module. For example, for a facility that is primarily relying on the solar module to meet their energy consumption needs, the target energetic efficiency may be set in a high range such as greater than 75%, greater than 80%, or greater than 85%. In another scenario, for a solar module that is to be installed in a highly visible area where aesthetics are important, the customer may be willing to accept a broader range of energetic efficiency (e.g., minimum 60% or minimum 70%) as a trade-off for higher aesthetic effectiveness.

Chromatic effectiveness determines a level of visual acceptability of a discontinuous image perceived by a human eye. Chromatic effectiveness is a qualitative measurement based on a user's preferences, which is also impacted by objective factors such as an average distance at which an observer will be viewing the solar panel, level of detail in the image to be printed (e.g., finer detail may require a higher resolution mesh), and angle at which the solar panel will be mounted relative to the observer's viewpoint. To determine a chromatic effectiveness that is acceptable to the customer, combinations of mesh counts (i.e., density of the mesh), mesh opening sizes, and yarn thicknesses that achieve a desired target energetic efficiency threshold may be varied, modeled (e.g., simulated and/or physically prototyped) and tested. Testing may include qualitative assessments and/or quantitative metrics such as numerical ratings.

The chromatic effectiveness depends on the observer's individual perception, and on the attitude to perception conditioned by the context in which the observer looks. These aspects are subjective, cannot be measured with a unique indicator and are linked to the following variables: (1) Proximity: objects that are placed close together are often seen as grouped; they are perceived not as separate parts, but as sets. (2) Similarity: when objects appear similar to each other, they are often perceived as part of a pattern. Similarity may be due to color, size or shape. (3) Continuity: elements that continue a pattern or follow a direction tend to be grouped as parts of the same pattern. (4) Closure: human beings perceive an enclosed space by completing the contours and ignoring any missing parts of the figure. (5) Figure-background: all the parts of a zone can be interpreted both as object and as background. The resolution of the rendering, related to printing technique and mesh parameters, is key in combining all such variables.

There are no theoretical standards on color rendering that definitively correlate the resolution of an image and the distance from which it is observed. There are, on the other hand, de facto standards. In some embodiments, an empirical correlation that states the minimum resolution necessary for human to have a good quality of vision is the following (resolution in point per inch) from The Print Handbook by Andy Brown Design.

TABLE 1

| Viewing Distance | Minimum Resolution (dpi = dots per inch) |
|---|---|
| 0.6 m/2 ft | 300 dpi |
| 1 m/3.3 ft | 180 dpi |
| 1.5 m/5 ft | 120 dpi |
| 2 m/6.5 ft | 90 dpi |
| 3 m/10 ft | 60 dpi |
| 5 m/16 ft | 35 dpi |
| 10 m/33 ft | 18 dpi |
| 15 m/50 ft | 12 dpi |
| 50 m/160 ft | 4 dpi |
| 60 m/200 ft | 3 dpi |
| 200 m/650 ft | 1 dpi |

The "virtual" resolution of the meshes of the present embodiments may be related to dpi by considering the opaque, printed parts of the meshes as "dots." With this analogy, typical commercial meshes are capable of a resolution between 10 ppi (pixels per inch) and 20 ppi. That means that embodiments of solar panels with colored meshes made from common commercial fabrics can provide the best visual perception at distances greater than 10 m/33 ft. In some embodiments, custom or other commercial fabrics (meshes) of finer weave (higher ppi and thus higher resolution) can be employed to achieve a desired aesthetic effectiveness for closer viewing distances, while taking into consideration the impact on energy efficiency of the solar panel. In further embodiments, a solar panel that will be viewed at greater distances (e.g., 15 m or more) may be chosen to use a mesh of a coarser weave (lower ppi and thus lower resolution) to achieve higher energy efficiency by transmitting more light to a solar panel than finer weaves, while still achieving sufficient chromatic effectiveness for the situation.

From the combinations of mesh configurations that meet the desired energetic efficiency and chromatic effectiveness goals, the warp fiber thickness, weft fiber thickness, and mesh open area size are determined for printing into a graphic mesh. In some embodiments, a minimum pixels per inch can be set according to a nominal viewing distance that the solar module will be viewed at, such as by using the resolution chart of Table 1 above, and then the warp fiber thickness, weft fiber thickness, and mesh open area size can be set to achieve a desired energetic efficiency.

Printing Configurations

Various methods and configurations for printing graphics onto the meshes of the present embodiments shall now be described. The present embodiments utilize processes and materials that are chosen to enable absorption of the ink into the mesh material. This absorption results in a printed image that is durable since the colors are embedded within the mesh media rather than being a coating or ink that is deposited on top of the media as in conventional approaches. The durability consideration of the printed image being absorbed by the mesh is important because high temperatures in the lamination process for assembling a photovoltaic panel can greatly reduce the chromatic rendering of the printed colors. In the present embodiments, because the ink is absorbed into the fabric, reduction of chromatic effectiveness during the lamination process is lower compared to surface-printed sheets, and the aesthetic rendering of the overall perceivable image remains more consistent with the original image. This durability—such as a resistance to fading due to heat exposure—is beneficial for time and costs of the printing phase.

TYPE OF MESH MATERIAL: Yarn is produced by spinning raw fibers of natural materials (wool, flax, cotton, hemp, cellulose and others) or synthetic materials (polymers, glass, metal, carbon, ceramic and others) to produce long strands. Textiles (or fabrics) are formed by interlacing, weaving, knitting, crocheting, knotting, melting, bonding or felting. A fiber, a single filament of natural material—such as cotton, linen or wool, or artificial material such as nylon, polyester, polyethylene, metal or mineral fiber, or man-made cellulosic fiber like viscose, Modal, Lyocell or other rayon fiber—is measured in terms of linear mass density, or the weight of a given length of fiber. Any of these fiber materials are possible for the present meshes. The specific choice of yarn material and the process used to make the yarn for the present meshes will be based on being able to absorb the coloring substance of the print, and being able to withstand the temperatures the fabric will be exposed to, especially during the lamination process necessary to make the photovoltaic panel. The ability to withstand mechanical stresses (e.g., deformation) during the manufacturing process and operation of the solar module can also be considered in the choice of mesh material.

Material properties that may be considered in choosing a fiber material for meshes to be used in solar modules are listed here, with absorbency and melt temperature being key factors but other possible properties being listed as well:

absorbency of the coloring substance melt temperature—e.g., >160° C. to endure lamination temperatures during manufacturing of a solar panel tenacity resistant to stretching and shrinking, particularly when heated resistant to most chemicals (e.g., acetic acid which can be released by EVA and can cause yellowing/staining of certain pigments over time)

resistant to ultraviolet radiation over the expected lifetime of a solar panel, such as more than 2 years or more than 5 years quick drying crisp and resilient when wet or dry wrinkle resistant mildew resistant abrasion resistant able to retain heat-set pleats and creases PRINTING PROCESSES: Textile printing in general is the process of applying color to fabric in definite patterns or designs. In properly printed fabrics, the color is bonded with the fiber to endure washing and wear. Wooden blocks, stencils, engraved plates, rollers, or silkscreens can be used to place colors on the fabric. Colorants used in printing contain dyes thickened to prevent the color from spreading by capillary attraction beyond the limits of the pattern or design. Printing processes generally involve several stages in order to prepare the fabric and printing paste, and to set the impression permanently on the fabric:

pre-treatment of fabric preparation of colors preparation of printing paste impression of paste on fabric using printing methods drying of fabric setting the printing with infrared, steam or hot air (for pigments)

post-process treatments (e.g. spraying, coating or dipping in ultraviolet protective substances or other treatments, such as graphene oxide based inks or UV protecting resins)

Various known textile printing techniques may be used to print the meshes of the present disclosure. These techniques can be broadly categorized into four styles:

Direct printing, in which colorants containing dyes, thickeners, and the mordants or substance necessary for fixation of the color on the fabric are printed in the desired pattern.

The printing of a mordant in the desired pattern prior to dyeing fabric; the color adheres only where the mordant was printed.

Resist dyeing, in which a wax or other substance is printed onto fabric which is subsequently dyed. The waxed areas do not accept the dye, leaving uncolored patterns against a colored ground.

Discharge printing, in which a bleaching agent is printed onto previously dyed fabrics to remove some or all of the color.

Methods that may be used to impress the colored patterns on fabric include, but are not limited to, these types of printing: hand block, perrotine, engraved copperplate, stencil, screen, discharge, lithographic, pad, digital (e.g. UV, dye sublimation, latex and others), roller, cylinder, or machine printing.

In choosing a printing technique (e.g., sublimation or latex) from the available printing technologies, characteristics may be considered that enable a mesh to be dyed better than when using other methods. For example, methods may be utilized that allow capturing of the ink dispersed through the holes in the mesh, thereby avoiding unwanted stains in the printed image.

In some embodiments, the fibers may be initially white to provide a background on which to print the graphic appearance. White fibers may enhance the vividness of colors being printed into the fibers. In other embodiments, other colors may be used for the initial fiber, prior to printing of an image.

Various combinations of the printing process phases, printing techniques and methods are possible for use in the present embodiments. With any of the chosen combinations, the technology used for printing the mesh should remove and collect the ink printed in the empty parts of the net (the holes in the mesh). This may be achieved through technologies incorporated in industrial printing machines such as ink-collectors or mesh-kits, based on absorbing the extra drops from the printed surfaces through industrial sponges. This collection of excess ink (or other coloring substance) helps to avoid staining the printed fabric (due to waste ink) that will be used in the lamination process and avoids excess ink from reducing the empty areas of the mesh (which would reduce the solar efficiency due to smaller areas for light to pass through).

Printing configurations are the result of the mesh fabric to be printed (that can have different shapes and can be made of different materials such as, for example, nylon, polyester, polyethylene) and the related printing technique. Regarding the shape of the mesh, there are several factors that contribute to determining the chromatic effectiveness:

(1) The geometry of the mesh affects the human perception of the printed rendering. Consequently, for a given image design, the visual perception of the image changes depending on the shape of the mesh it is printed on.
(2) The dimension of the mesh holes affects the resolution of the image perceived. The greater the opaque portion of the fabric, the higher the resolution.
(3) The thickness of the yarn affects the quantity of dye that is absorbed by the fabric. That affects the perceived resolution.
(4) The characteristic of a mesh to be coarser or finer does not directly affect the choice of the type of ink, but it can affect the selection of the type of printing machinery because different types of machines use different techniques to recover/recycle the spare printing inks (excess ink that remains in the mesh openings from printing and needs to be removed to avoid stains).
(5) The nature of a synthetic material used to make the yarn can greatly affect the choice of the needed printing technique and of the type of ink, due to the resistance of the material to different conditions in terms of pressure, temperature, mechanical traction, and absorption capacity. For example, different inks need to be chosen for diverse types of synthetic material to be printed. As a more specific example, with nylon it is not possible to print by sublimation because the sublimation ink does not permeate nylon, while it does with polyester. With nylon it is necessary to use ultra-violet or latex based printing techniques; such combinations will offer a better chromatic effectiveness as well as a longer resistance to ultra-violet exposure. Different combinations of materials to be printed and inks imply different process timing (e.g., sublimation allows paper pre-printing and subsequent post-impression from paper to polyester, which implies more flexibility and shorter printing processes because it supports parallel, instead of serial, treatments) as well as different costs (polyester, for example, is usually cheaper than nylon).

Figure 11:
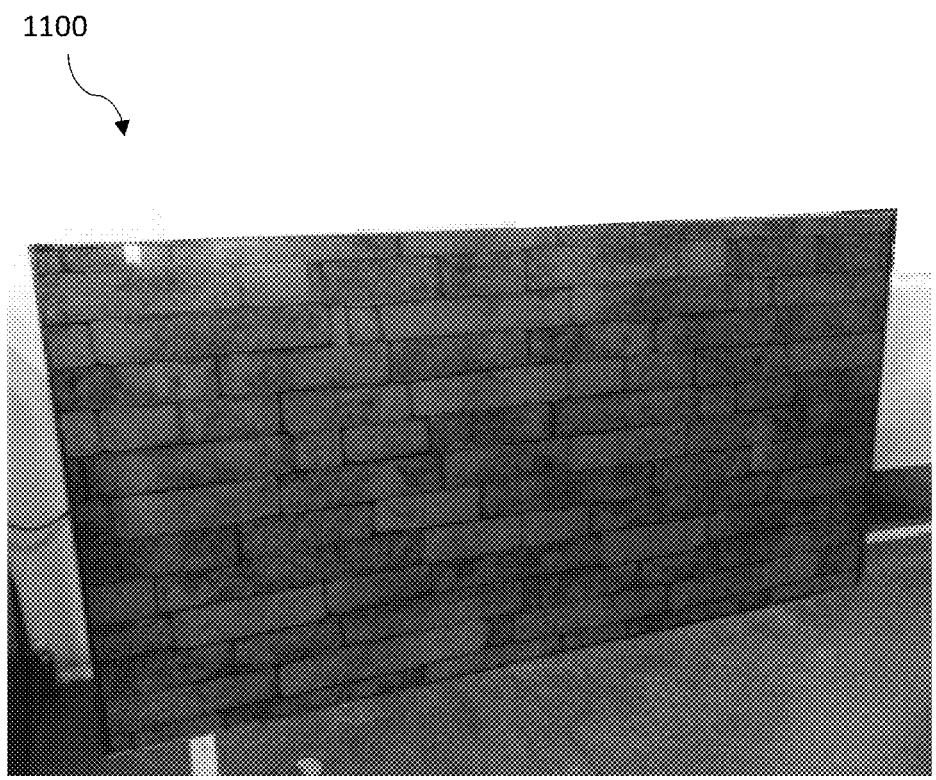
FIG. 11 is a photograph of a solar panel having a graphic mesh incorporated into it, in accordance with some embodiments.

As an example of an implementation of a printed graphic mesh incorporated into a solar panel, FIG. 11 shows an example of a glass solar panel 1100 made by inserting a polyester, sublimation printed fabric, with a rendering of a colored wall (stone wall image) printed into the fabric mesh, under a glass frontsheet. The mesh used in the solar panel 1100 had a square mesh geometry with a unit cell size of 1.25 mm×1.25 mm, a weft yarn thickness of 0.15 mm and a warp yarn thickness of 0.15 mm. The geometric (energetic) efficiency was calculated to be 81%, with an actual energetic efficiency being measured at 83%. The solar panel 1100 demonstrates the ability to disguise a panel with an effective visual rendering (chromatic effectiveness), while still achieving high energetic efficiency of sunlight being transmitted through the mesh.

Relative Positioning of Layers

As previously described, a solar panel is created as a stack of several adjacent layers of different materials. The relative positioning of the layers is related to desired properties of the resulting photovoltaic panel. One property is stiffness, as the photovoltaic panel needs to resist mechanical forces encountered during installment, from weather conditions, and due its own weight. Energetic efficiency is another property that affects the layer stacking, since as much light as possible has to be captured, not reflected or dispersed, to be transformed into electric energy. Exposure to ultraviolet light from solar irradiance can progressively deteriorate efficiency. Absence of moisture is another desirable property. When laminated, there should not be any moisture inside of the panel so as not to effect chromatic effectiveness and durability of the panel.

The type of material the mesh is made of, the size and shape of the net, and the relative position of the fabric inserted into the stack may affect the chromatic effectiveness (quality of the rendered image), the energetic efficiency, and the overall robustness of the final panel. The energetic efficiency is also related to the specific process and components (especially the solar cells) used to make the panel as a whole. Any possible extra layers integrated in the lamination stack may affect the resistance of the panel to external weather conditions and its chromatic and progressive deterioration of efficiency due to exposure to ultraviolet radiation.

Figure 5:
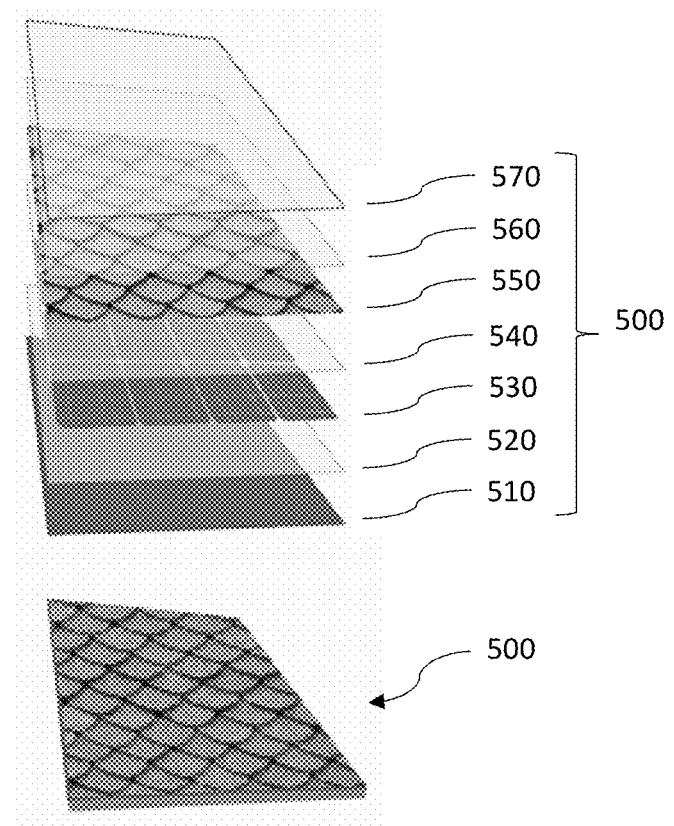
FIG. 5 is an exploded view of layers in a photovoltaic panel having a graphic mesh, in accordance with some embodiments.

The relative positioning of the printed mesh can greatly affect such properties. FIG. 5 is a possible template for a stack for a solar module 500 that has a printed mesh, where the stacked sequence has a bottom backsheet layer 510 which is typically black, a first encapsulant layer 520 (e.g., EVA or POE film) to bond the adjacent layers together, a solar cell layer 530, a second encapsulant layer 540, a colored mesh 550, a third encapsulant layer 560 and a top layer frontsheet 570. In various embodiments, the colored mesh 550 can be placed closer the solar cells 530 or closer to the frontsheet 570 in the stack, depending on the mechanical properties of the mesh and the desired properties of the overall module. For example, a mesh that is closer to the solar cells may create a more flexible panel for applications where the panel is installed on a curved surface or where the panel will be subject to vibrations. In another example, the relative position in the stack of a mesh made of fine thread and a coarse weave (i.e., large openings) may not significantly impact the mechanical properties of the overall panel and may be chosen for placement closer to the frontsheet to maximize its visual impact.

The lamination process is the transformation phase through which several layers are combined together to form a single, compact panel. The layers are stacked on top of each other and inserted into a laminator, which applies pressure and heat so that the encapsulating layers bond the stack together. For example, the lamination may involve drawing a vacuum to compress the layers together and heating the assembly to 140-200° C. for 10-30 minutes, such as at 145° C. for 20 minutes.

In embodiments, a solar module includes a solar cell layer, a graphic mesh, and an encapsulating layer. The solar cell layer has a plurality of solar cells with light-incident surfaces. The graphic mesh is placed over the light-incident surfaces of the plurality of solar cells. The graphic mesh has a plurality of fibers interlaced with each other and forming openings between the plurality of fibers. The graphic mesh has a graphic appearance printed into the plurality of fibers by absorbing a coloring substance. The encapsulating layer is over the graphic mesh, where the encapsulating layer, the graphic mesh and the solar cell layer are laminated together. The graphic mesh has a warp fiber thickness, a weft fiber thickness, and an open area size of the graphic mesh to meet a target energetic efficiency and a chromatic effectiveness.

In some embodiments, solar modules may also include a frontsheet over the encapsulating layer, where the graphic mesh is laminated into the solar module as a layer between the solar cell layer and the frontsheet. In some embodiments, the encapsulating comprises a polyolefin elastomer. In some embodiments, the graphic mesh has an energetic efficiency that is the open area size divided by a size of a mesh unit cell, where the size of the mesh unit cell includes the warp fiber thickness and the weft fiber thickness, and where the energetic efficiency is equal to or greater than the target energetic efficiency. In some embodiments, the chromatic effectiveness is based on a mesh count that is set according to a distance at which the graphic mesh will be viewed when assembled into the solar module.

Methods

Figure 6:
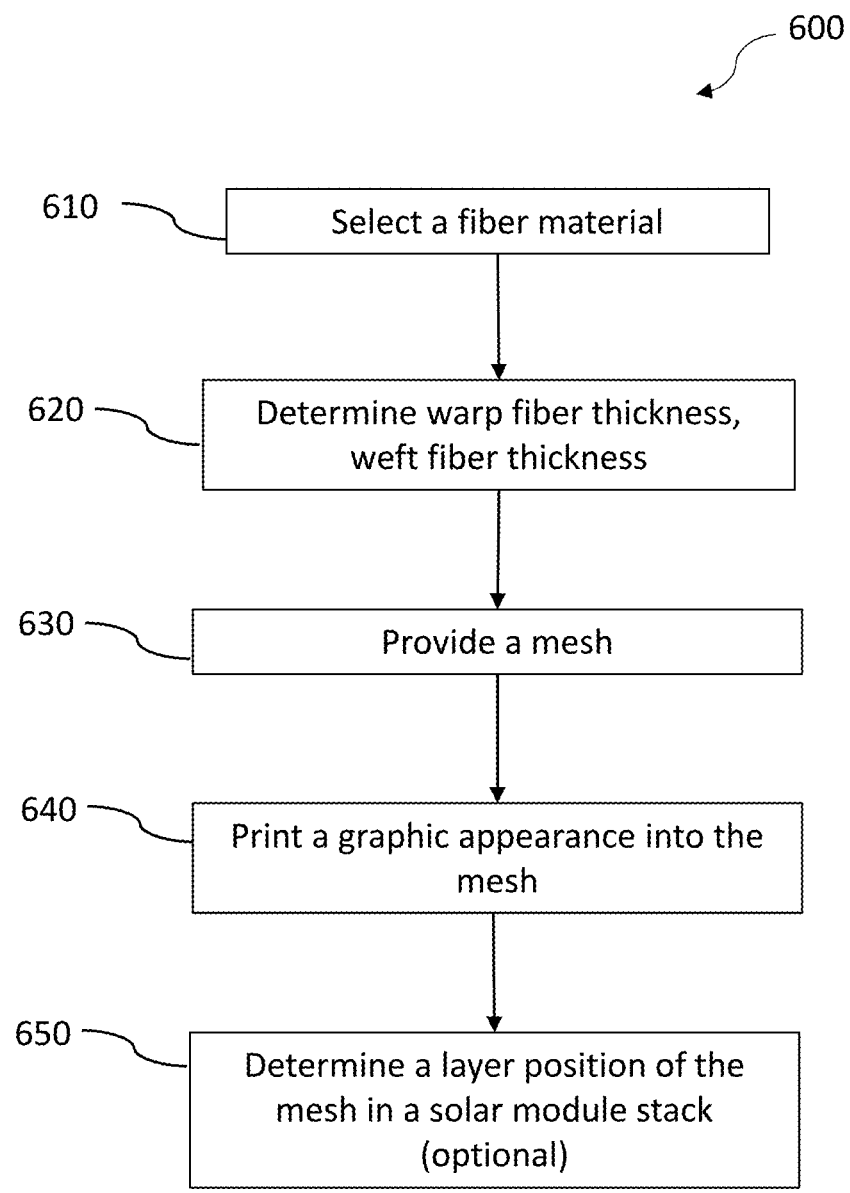
FIG. 6 is a flowchart of methods for producing a graphic mesh, in accordance with some embodiments.

FIG. 6 is a flowchart 600 for producing a graphic mesh for a solar module. In some embodiments, step 610 involves selecting a fiber material for a mesh, the fiber material being absorbent for a coloring substance. Other material properties as described above can be considered, such as a melt temperature that is higher than a lamination temperature used for assembling the graphic mesh into the solar module. In some embodiments, the fiber material is absorbent for a coloring substance and is pre-determined, such as being specified by a customer.

Step 620 involves determining a warp fiber thickness, a weft fiber thickness, to meet a target energetic efficiency and a chromatic effectiveness. Step 620 may also include determining other mesh parameters such as a mesh open area. For example, a customer may specify a certain amount of power to be produced and certain conditions under which the panel will be viewed (e.g., distance between the solar module and an observer, amount of detail the graphic will have, and/or how prominently the module will be displayed). Based on these conditions, combinations of fiber thicknesses and mesh open area can be tested, such as quantitatively and qualitatively, to determine values that best meet the energetic efficiency and chromatic effectiveness requirements. This ability to adjust mesh geometry for individually-customized requirements is a unique advantage of using a mesh as a graphic component for solar modules.

In some embodiments of step 620, the determining comprises calculating an energetic efficiency as the open area size divided by a size of the mesh unit cell, where the size of the mesh unit cell includes the warp fiber thickness and the weft fiber thickness. The open area size may also be expressed as the size of the mesh unit cell without the warp fiber thickness and the weft fiber thickness. In some embodiments, the chromatic effectiveness is based on a viewing distance at which the graphic mesh will be observed. In some embodiments of step 620, the determining utilizes a chromatic effectiveness that is based on a mesh count, wherein the mesh count is set according to a distance at which the mesh will be viewed when assembled into the solar module. In such embodiments, the resolution and therefore mesh count can be determined according to the expected viewing distance, and the warp fiber thickness and weft fiber thickness of the mesh (and consequently mesh open area) can then be tailored to meet a target energetic efficiency.

In step 630 a mesh is provided, the mesh being made of the fiber material of step 610 and having the dimensions determined in step 620. In the mesh, a plurality of warp fibers having the warp fiber thickness and a plurality of weft fibers having the weft fiber thickness are interlaced to form a plurality of openings having the mesh open area size. The mesh can also be described in terms of unit cells, where the plurality of warp fibers and the plurality of weft fibers are interlaced to form a plurality of mesh unit cells, each mesh unit cell having an opening with the open area size or having a mesh unit cell size according to the mesh count.

Step 640 involves printing a graphic appearance into the mesh using the coloring substance, wherein the coloring substance is absorbed into the fiber material to form a graphic (printed) mesh. The printing may include removing excess of the coloring substance from a plurality of openings in the mesh, where the plurality of openings are formed by the interlaced plurality of warp fibers and plurality of weft fibers. As described throughout this disclosure, having the coloring substance be embedded into the fiber material of the mesh greatly improves the ability of the printed image to endure long-term exposure to sunlight, and is another important advantage of the present embodiments over conventional systems.

In addition to producing a mesh for use in a solar module from steps 610 through 640, in some embodiments, the method 600 optionally includes step 650 of determining a layer position of the mesh within a stack of layers for the solar module, based on a desired mechanical property of the solar module and/or chromatic effectiveness of the graphic mesh in the module. The determination of layer position can take into consideration various factors such as visibility (e.g., closer to the frontsheet for more visibility) and mechanical properties of the panel (e.g., flexibility vs. stiffness). For example, the layer position may be based on the chromatic effectiveness and a desired stiffness of the solar module.

Figure 7:
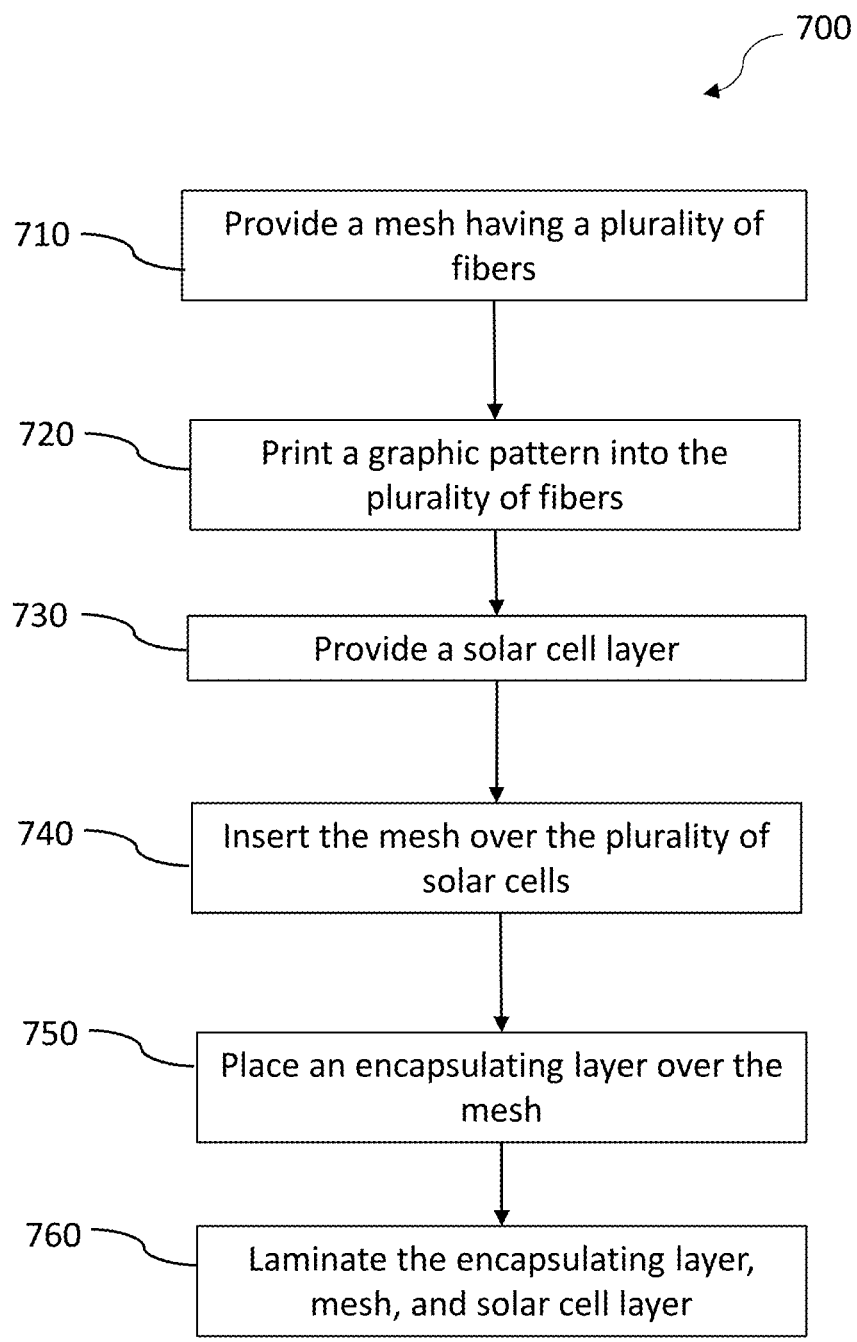
FIG. 7 is a flowchart of methods for fabricating a solar module having a graphic mesh, in accordance with some embodiments.

FIG. 7 is a flowchart 700 representing methods for forming a solar module, in accordance with some embodiments. In step 710 a mesh is provided, where the mesh has a plurality of fibers interlaced with each other and form openings between the plurality of fibers. In step 720 a graphic pattern is printed into the plurality of fibers, such that the coloring substance (e.g., dye, ink, pigment) is absorbed into the fibers. In step 730 a solar cell layer is provided, the solar cell layer having a plurality of solar cells with light-incident surfaces. Step 740 involves inserting (i.e., placing) the graphic mesh as a layer of the solar module, over the light-incident surfaces of the solar cell layer. An encapsulating layer is placed over the graphic mesh in step 750, where the placement in the layer stack of the photovoltaic module can vary according to the specifications of the individual application. For example, the mesh may be directly on the surface of the solar cell layer, adjacent to the frontsheet, or in any layer between the solar cell layer and the frontsheet layer. In some embodiments, a frontsheet is placed directly on the encapsulating layer of the graphic mesh. The encapsulating layer may include, for example, a polyolefin elastomer. In step 760 the photovoltaic module is laminated together, including the encapsulating layer, the mesh and the solar cell layer.

EXAMPLES

The image on the mesh that is perceived by the human eye is actually a sampling of discontinuous, pixeled images. The image appears as pixeled because of the holes in the mesh that constitute the fabric where the image itself is printed. The cases analyzed hereafter are examples of determining possible combinations of chromatic effectiveness and energetic efficiency to achieve the most effective results.

Example A

Figure 8:
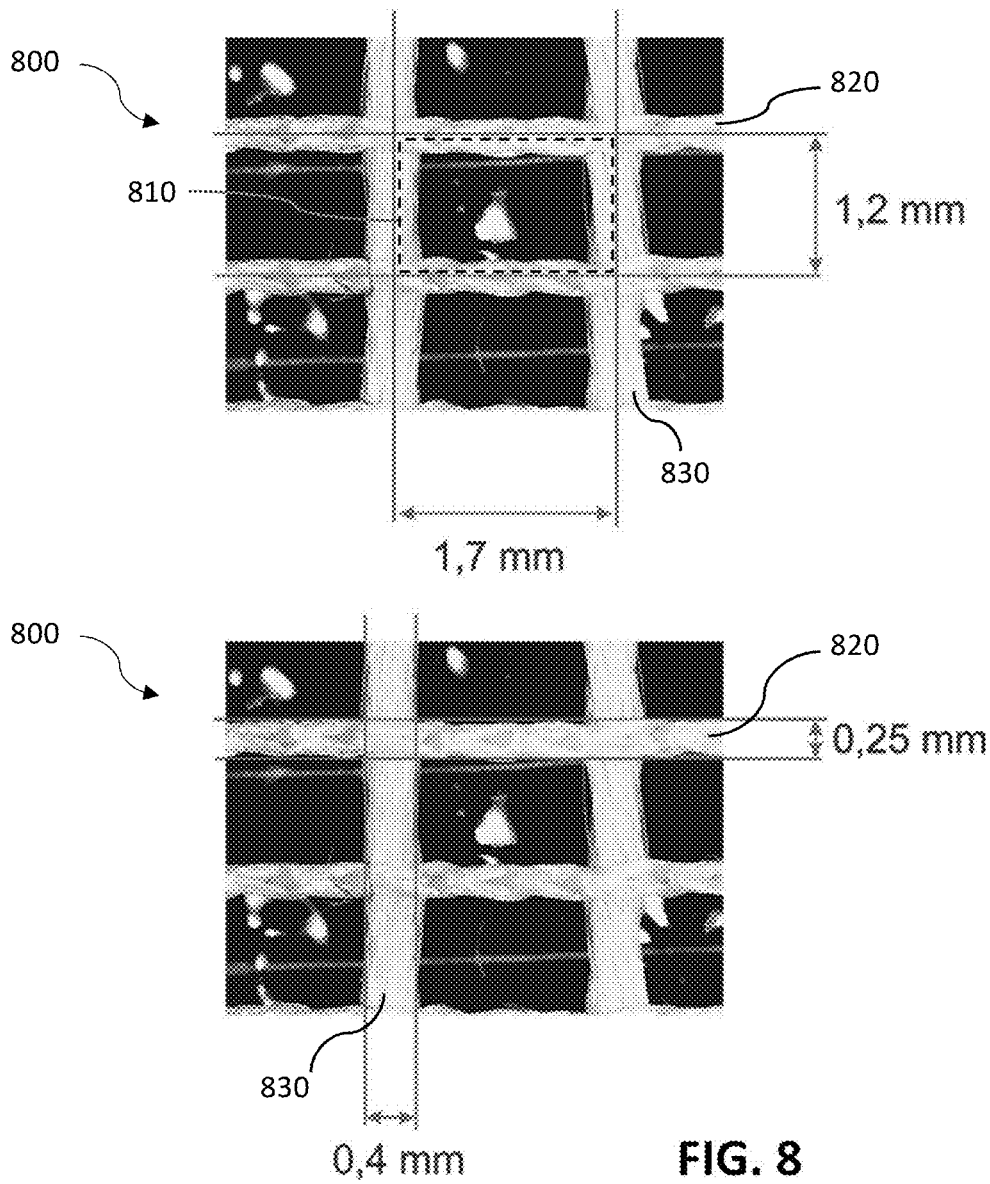
FIG. 8 is an example of a geometric design for a graphic mesh, in accordance with some embodiments.

FIG. 8 shows an example embodiment of a rectangular mesh 800 where mesh unit cells 810 (dashed line) have dimensions of 1.7 mm wide×1.2 mm high. The thickness of the weft (horizontal) yarn 820 is 0.25 mm, and the thickness of the warp (vertical) yarn 830 is 0.4 mm. Consequently, the geometric efficiency of the mesh is 60%, as shown by the calculation in FIG. 8, based on Equation 1b earlier in this disclosure, which calculates the percentage of open area that is available in the mesh compared to no mesh being present.

Example B

Figure 9:
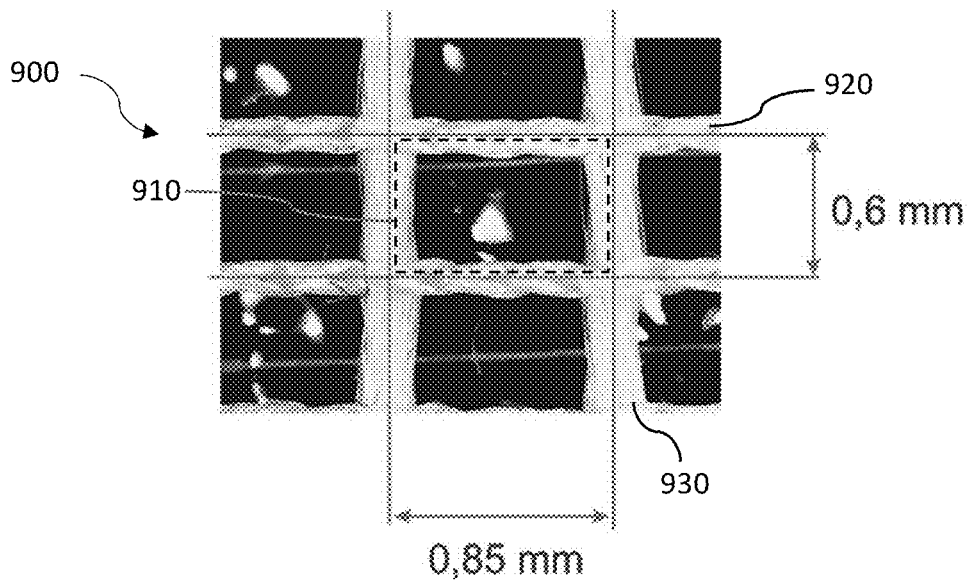
FIG. 9 is another example of a geometric design for a graphic mesh, in accordance with some embodiments.
Figure 9:
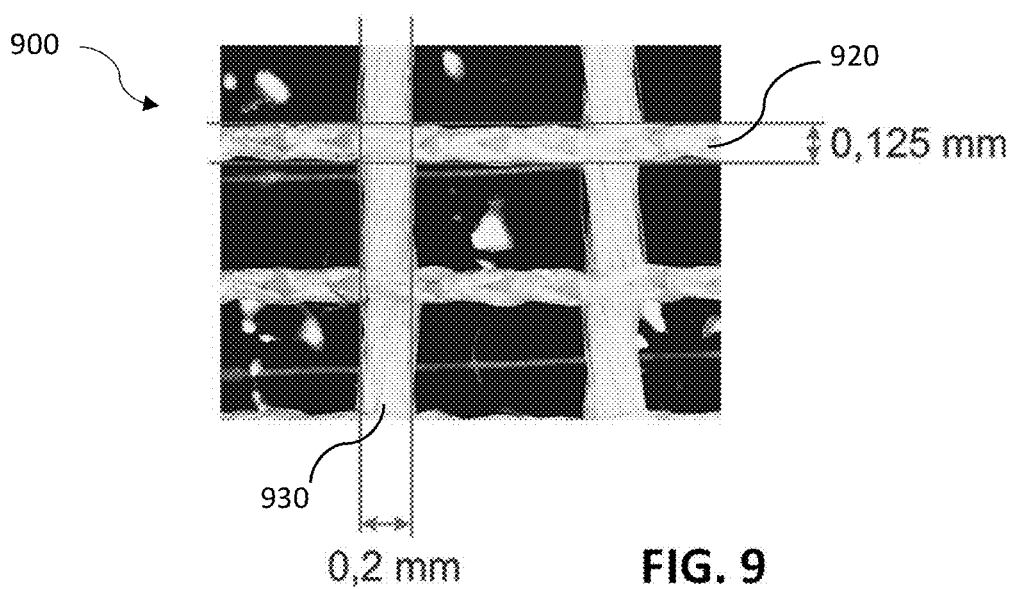

FIG. 9 shows an embodiment of a mesh 900 with the same geometric (energetic) efficiency as Example A, but with a higher chromatic effectiveness. The mesh unit cells 910 have dimensions of 0.85 mm wide×0.6 mm high, the thickness of the weft yarn 920 is 0.125 mm, and the thickness of the warp yarn 930 is 0.2 mm. The thinner yarns compared to Example A can provide more mechanical flexibility to the assembled solar panel, which may be suitable for use in an application such as a foldable panel. The yarns are half the thickness of Example A but the mesh openings are also half the size, resulting in the same energetic efficiency of 60% as Example A. The chromatic effectiveness is higher than Example A due to the finer mesh (smaller mesh openings).

Example C

Figure 10:
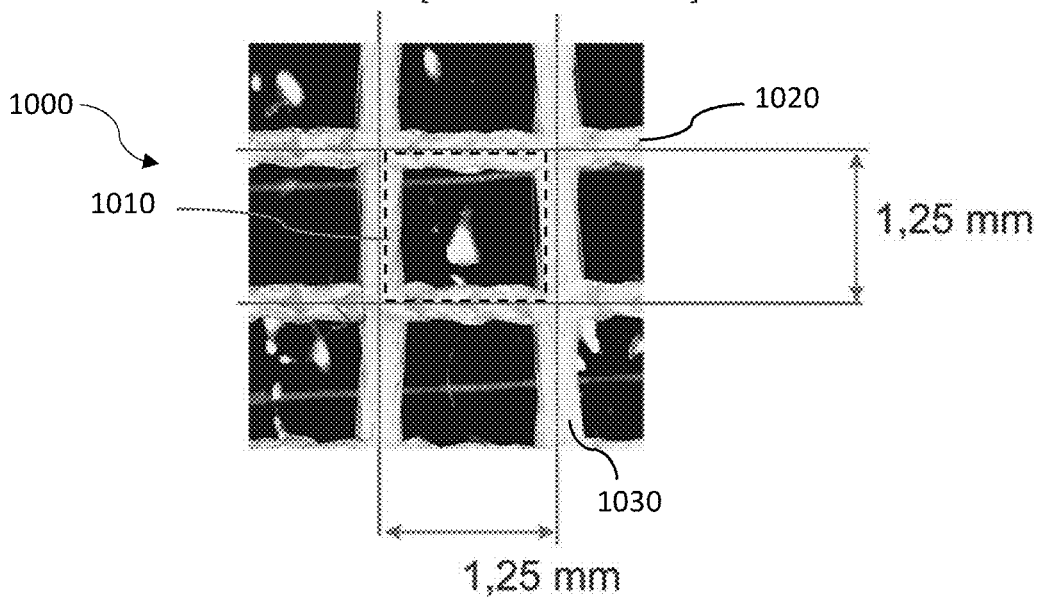
FIG. 10 is a further example of a geometric design for a graphic mesh, in accordance with some embodiments.
Figure 10:
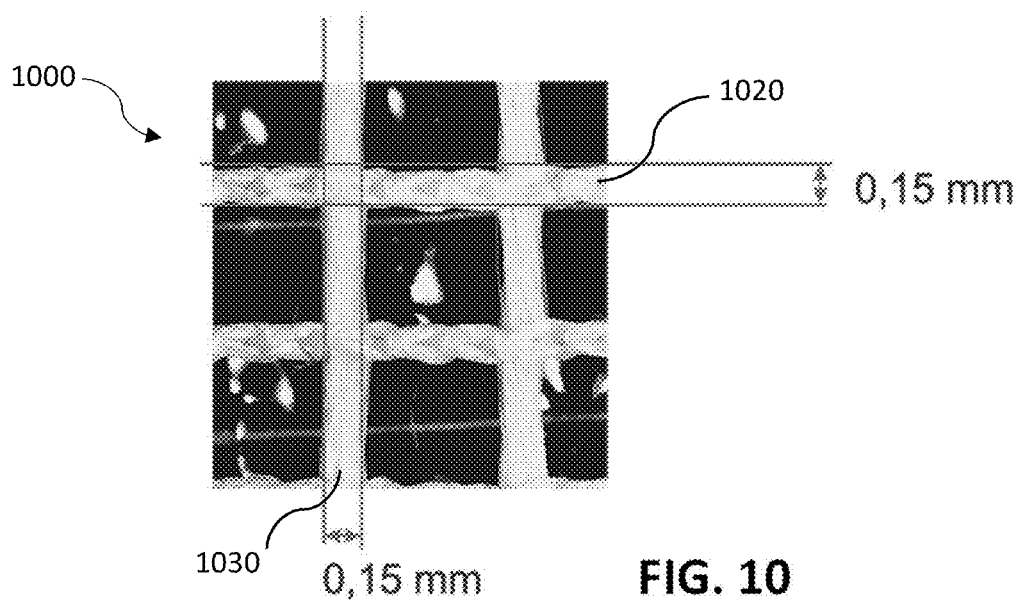

FIG. 10 shows an embodiment of a mesh 1000 where both the energetic efficiency and chromatic effectiveness are improved (greater than) compared to Example A. The mesh unit cells 1010 have dimensions of 1.25 mm wide×1.25 mm high, the thickness of the weft yarn 1020 is 0.15 mm, and the thickness of the warp yarn 1030 is 0.15 mm. The size of the mesh opening in this design results in a higher chromatic effectiveness than Example A, but slightly lower than Example B. The geometric efficiency of Example C is 81%, which is higher than Example A. This is because even though the mesh openings are smaller than Example A, the yarns are thinner.

These examples illustrate the ability to customize the properties of the mesh according to the design specifications of the particular photovoltaic panel. The yarn materials and the placement of the mesh within the photovoltaic panel stack can further customize the properties of the final panel.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of producing a solar module having a graphic mesh, the method comprising:
    selecting a fiber material for a mesh, the fiber material being absorbent for a coloring substance;
    determining a warp fiber thickness, a weft fiber thickness, and an open area size of the mesh to meet a target energetic efficiency and a chromatic effectiveness;
    providing the mesh made of the fiber material, the mesh configured for placing over light-incident surfaces of a solar cell layer of the solar module, wherein a plurality of warp fibers having the warp fiber thickness and a plurality of weft fibers having the weft fiber thickness are interlaced to form a plurality of mesh unit cells, each mesh unit cell having an opening with the open area size;
    printing a graphic appearance into the mesh using the coloring substance, wherein the coloring substance is absorbed by the fiber material to form the graphic mesh;
    inserting the graphic mesh as a layer of the solar module, over the light-incident surfaces of the solar cell layer; and
    encapsulating the graphic mesh with an encapsulating layer.

2. The method of claim 1, wherein the determining comprises calculating an energetic efficiency as the open area size divided by a size of the mesh unit cell, wherein the size of the mesh unit cell includes the warp fiber thickness and the weft fiber thickness.

3. The method of claim 1, wherein the chromatic effectiveness is based on a viewing distance at which the graphic mesh will be observed.

4. The method of claim 1, wherein the fiber material has a melt temperature that is higher than a lamination temperature for assembling the graphic mesh into the solar module.

5. The method of claim 1, further comprising determining a layer position of the mesh within a stack of layers for the solar module, based on the chromatic effectiveness and a desired stiffness of the solar module.

6. The method of claim 1,
wherein the encapsulating layer comprises a polyolefin elastomer.

7. The method of claim 6, further comprising placing a frontsheet over the encapsulating layer.

8. The method of claim 1, wherein the target energetic efficiency is a minimum threshold.

9. The method of claim 1, further comprising choosing the fiber material based on an ability of the fiber material to absorb the coloring substance.

10. The method of claim 1, further comprising collecting excess coloring substance from the openings in the mesh after printing the graphic appearance.

* * * * *